United States Patent
Peng

(10) Patent No.: US 6,294,838 B1
(45) Date of Patent: Sep. 25, 2001

(54) MULTI-CHIP STACKED PACKAGE

(75) Inventor: Gentle Peng, Hsin-Chu (TW)

(73) Assignee: Utron Technology Inc., Hsin-Chu (TW)

( * ) Notice: Subject to any disclaimer, the term of this patent is extended or adjusted under 35 U.S.C. 154(b) by 0 days.

(21) Appl. No.: 08/936,771

(22) Filed: Sep. 24, 1997

(51) Int. Cl.[7] ............ H01L 23/48; H01L 23/52; H01L 29/40
(52) U.S. Cl. ............ 257/777; 257/686; 257/778
(58) Field of Search ............ 257/685, 686, 257/778, 659, 658, 692, 666, 777, 723, 724

(56) References Cited

U.S. PATENT DOCUMENTS

| | | |
|---|---|---|
| 4,761,681 * | 8/1988 | Reid . |
| 5,151,769 * | 9/1992 | Immorlica et al. ........ 257/659 |
| 5,394,303 * | 2/1995 | Yamaji . |
| 5,644,167 * | 7/1997 | Weiler et al. . |

* cited by examiner

Primary Examiner—Sheila V. Clark
(74) Attorney, Agent, or Firm—H. C. Lin

(57) ABSTRACT

Two IC chips in a multiple-chip module are stacked together on a common lead frame or substrate of a ball-grid array package to save space. The top chip is wire-bonded to the lead frame. The bottom chip is flip-chip bonded to the lead frame, thus allowing more leads. The common substrate of the two chips are connected together by a conductive layer of metal plate, solder or conductive epoxy. The connecting layer may serve as a heat sinking element or a common electrical terminal.

4 Claims, 2 Drawing Sheets

MULTI-CHIP STACKED PACKAGE

INTRODUCTION

This invention relates to multiple chip module, in particular to ball grid array package.

With ever increase in circuit complexity and demand for miniaturization, the area of an integrated circuits becomes larger and the number of connections to the IC tends to increase. One popular package to serve this trend is the ball grid array (BGA) package. In this package, printed wiring is deposited on a plastic, ceramic, polyimide, etc. substrate as a lead frame. The IC is flip-chip bonded or wire bonded to the printed wiring substrate. These printed wires are connected to the bottom of the substrate through plated-through via holes. These leads are terminated at the bottom of the substrate in the form of beads or balls, and arranged in a matrix array. This array of beads can then be mounted on a printed circuit board by mating the beads with solder bumps on the printed circuit board.

However, the demand for more leads is ever increasing. One way to accommodate more leads is to use a substrate of multiple layer lamina. Each layer has its own printed wiring which are connected to the flip chip IC through via holes. The multiple layer lamina allows more terminals to be connected to the IC and to be interconnected. However, the use of lamina substrate adds to the cost of packaging.

Another problem of IC design is that the number of bonding pads on an IC is limited, because the area occupied by a bonding pad is relatively large and space must be allowed between pads. For small IC chip, there cannot be a large number of bonding pads. Sometimes it is desirable to have more bonding pads than allowed.

A multiple-chip module (MCM) usually occupies more area than the area of a single IC chip. It is not convenient to mount multiple chips on a BGA substrate.

SUMMARY

An object of the present invention is to increase the allowable IC leads in a BGA package. Another object of the present invention is to mount more than one IC chip on a BGA package as a multiple-chip module. Still another object of the present invention is to permit fewer layers of a BGA lamina. A further object of the present invention is to provide a common ground and heat sink for two IC chips.

These objects are achieved by stacking two IC chips back to back and gluing them together. The lower chip is flip-chip bonded to the lead frame or substrate of a BGA package, and the upper chip is wire bonded to the printed wiring of the lead frame. The common contact between the two chips can serve a common electrical terminal, a shield against crosstalk, and/or serve as a heat sink.

DETAILED DESCRIPTION OF THE PREFERRED EMBODIMENT

Figure 1:
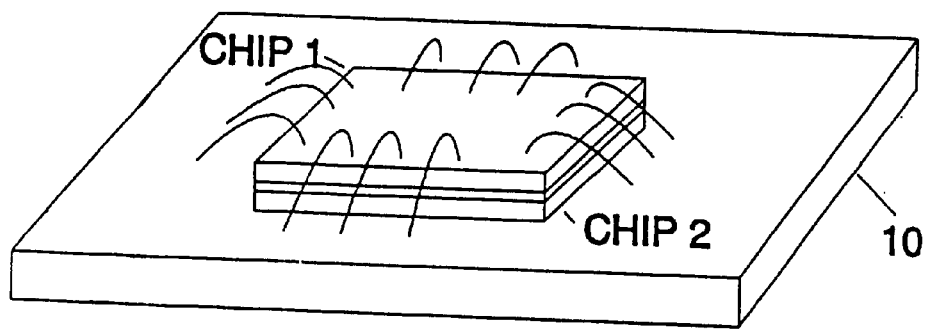
FIG. 1 shows a view of the stacked chips of the present invention.

FIG. 1 shows two IC chips stacked together according to the present invention. Two chips, CHIP1 and CHIP2 are stacked together with CHIP2 on top over an insulating substrate 10 such as that the lead frame used in a BGA package. These two chips are stacked together back-to-back with their silicon substrates in contact. The active surface with bonding pads of CHIP2 faces upward, and the active surface with bonding pads of CHIP1 faces downward as a flip chip.

Figure 2:
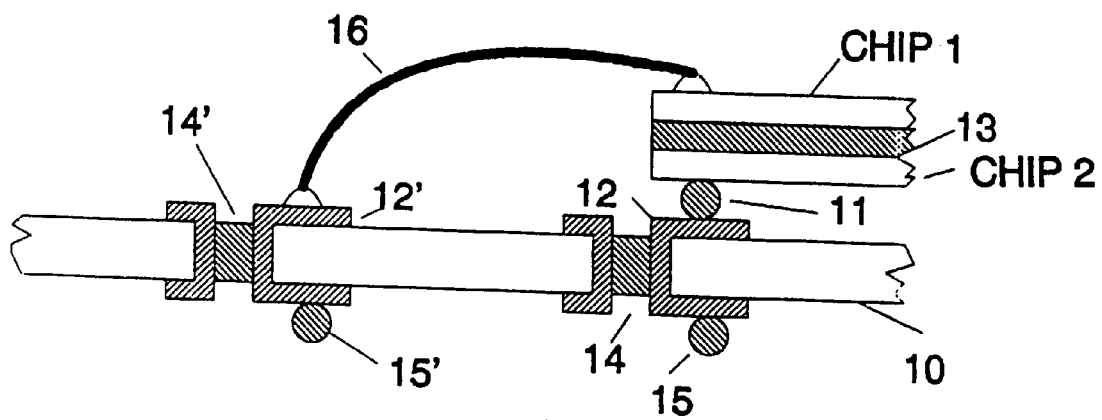
FIG. 2 shows the bonding of the stacked chips.

FIG. 2 shows the bonding of the two chips to the lead frame 10. The flip chip has solder bumps 11 on its bonding pads. The substrate has printed wires 12 over which the flip chip can be bonded. The printed wires are fed to the bottom of the lead frame 12 via one of plated-through holes 14, which is connected to a ball 15 of a ball grid array.

The bonding pads of the upper chip CHIP2 are bonded by wires such as wire 16 to the printed wire 12' and fed via the plated-through hole 14' to another solder ball 15' of the ball grid array as shown in FIG. 2. The two chips are glued together by conductive epoxy 13 to form a common electrical terminal such as the most negative terminal of power supply. They can also be connected together by soldering to a common metal plate. This conductive plate may serve as a common electrical terminal such as ground, a shield against crosstalk between the two chips, and a heat removal layer or heat sink to conduct away heat generated in the ICs.

Figure 3:
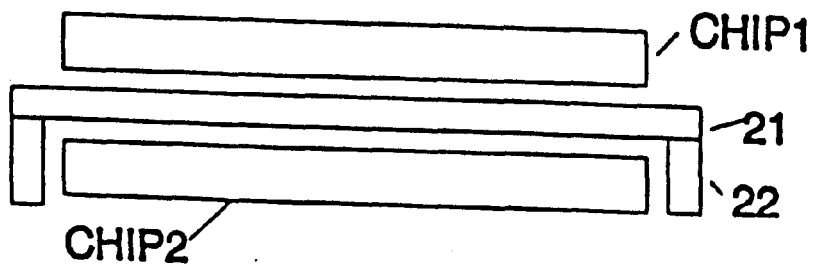
FIG. 3 and FIGS. 3a, 3b, 3c and 3d show the structures of a metal plate between two chips.
Figure 3A:
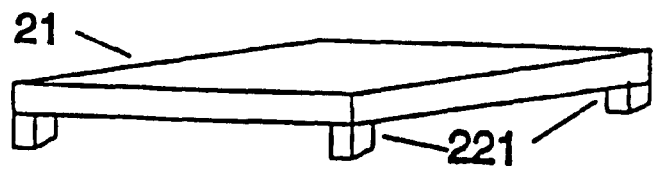
Figure 3B:
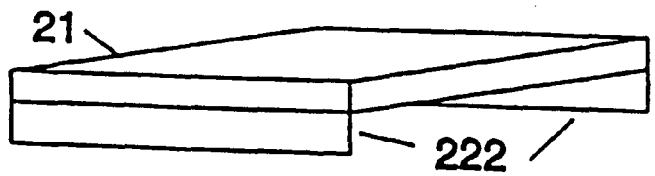
Figure 3C:
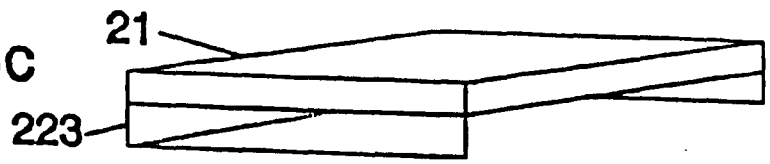
Figure 3D:
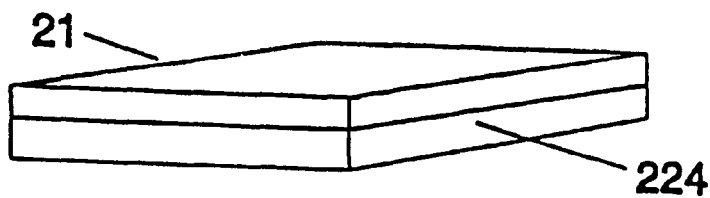

FIG. 3 shows another embodiment of the present invention. In this structure the metal plate 21 between Chip1 and Chip 2 is supported at its edges as shown in FIG. 3. The purpose of the support 22 is to prevent the Chip1 from pressing against Chip 2 while wire-bonding Chip 1. The support is furnished by four legs 221 as shown in FIG. 3a; by two walls 222 as shown in FIG. 3b; by three walls 223 as shown in FIG. 3c; and by four walls 224 as shown in FIG. 3d.

For low pin count, a single layer of lead frame may be sufficient. For more pin counts, the printed substrate may be a lamina with multiple layers of printed wiring. Each layer can have connections to the two IC chips through via holes.

After wiring bonding, the chips may be sealed by applying glue over the chips and the bonding wires.

While the preferred embodiment of the invention has been shown and described, it will be apparent to those skilled in this art that various modifications may be made in the embodiment without departing from the spirit of the present invention. Such modifications are all within the scope of this invention.

What is claimed is:

1. A multiple-chip stacked package, comprising:
   an insulating substrate;
   a first integrated circuit (IC) chip having terminals coupled to said substrate by flip-chip;
   a second IC chip stacked over said first IC chip and having terminals coupled to said substrate by wire bonding; and
   a metal plate placed between said first IC chip and said second IC chip and supported by four legs.

2. A multiple-chip stacked package comprising:
   an insulating substrate;
   a first integrated circuit (IC) chip having terminals coupled to said substrate by flip chip;
   a second IC chip stacked over said first IC chip and having terminals coupled to said substrate by wire bonding; and
   a metal plate placed between said first IC chip and said second IC chip and supported by two walls.

3. A multiple-chip stacked package comprising:
   an insulating substrate;

a first integrated circuit (IC) chip having terminals coupled to said substrate by flip chip;

a second IC chip stacked over said first IC chip and having terminals coupled to said substrate by wire-bonding; and a metal plate placed between said first IC chip and said second IC chip and supported by three walls.

4. A multiple-chip stacked package comprising:

an insulating substrate;

a first integrated circuit (IC) chip having terminals coupled to said substrate by flip-chip;

a second IC chip stacked over said first IC chip and having terminals coupled to said substrate by wire-bonding; and a metal plate placed between said first IC chip and said second IC chip and supported by four walls.

* * * * *